(12) United States Patent
Nishiyama

(10) Patent No.: US 7,570,680 B2
(45) Date of Patent: Aug. 4, 2009

(54) LASER DIODE DRIVER WITH MULTIPLE MODULATION CURRENT SOURCE

(75) Inventor: Naoki Nishiyama, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 11/978,706

(22) Filed: Oct. 30, 2007

(65) Prior Publication Data

US 2008/0117943 A1    May 22, 2008

(30) Foreign Application Priority Data

Oct. 31, 2006    (JP)    ............................. 2006-296514

(51) Int. Cl.
*H01S 3/10* (2006.01)
*H01S 3/13* (2006.01)
*H01S 3/00* (2006.01)

(52) U.S. Cl. .................. 372/38.02; 372/26; 372/29.021

(58) Field of Classification Search .................... 372/26, 372/29.023, 30, 31, 38.02, 38.03, 38.07, 372/29.021, 38.01
See application file for complete search history.

(56) References Cited

U.S. PATENT DOCUMENTS 6,683,836 B2 *    1/2004    Miyagawa et al. ....... 369/53.26

FOREIGN PATENT DOCUMENTS

JP    60-187075    9/1985

* cited by examiner

*Primary Examiner*—Armando Rodriguez
(74) *Attorney, Agent, or Firm*—Smith, Gambrell & Russell, LLP

(57) ABSTRACT

The present invention is to provide an LD-driver that enables to adjust the waveform of the driving current to the LD even the driver is constituted with a current controlled device such as bipolar transistor. The LD-driver of the invention provides a plurality of modulation current sources each having a function to set the amplitude, the phase and the pulse width of the current output independently. The LD is provided with the modulation current superposed with each current derived from respective current sources.

12 Claims, 13 Drawing Sheets

LASER DIODE DRIVER WITH MULTIPLE MODULATION CURRENT SOURCE

BACKGROUND OF THE INVENTION

1. Field of the Invention

The present invention relates to a laser diode driver (LD-driver) to drive a semiconductor laser diode (hereafter denoted as LD).

2. Related Prior Art

The LD-driver drives the LD by receiving a driving signal and applying a modulation current modulated by the received driving signal. A conventional LD-driver usually includes a modulation current source and a bias current source with a current switching circuit operated by the driving signal. Supplying the driving signal with a differential mode to the current switching circuit with a paired transistor to switch the current. from the current source, the optical output from the LD may be modulated in accordance with the driving signal.

Japanese Patent Application published as JP-S60-187075A has disclosed a driver circuit for the LD, where one of the inputs of the differential circuit provides a capacitor to suppress the relaxation oscillation of the LD. This driver relaxes the leading edge of the modulation current, thus, relaxes the degradation of the optical output waveform due to the relaxation oscillation.

The conventional driver mentioned above has applied field effect transistors (FETs) for the differential circuit. The voltage controlled device, such as FET, may effectively control the current flowing in the. device by the input voltage because of their small trans-conductance. On the other hand, the bipolar device, typically a bipolar transistor with a current controlled configuration, seems to be hard to precisely control, in other words to control in analogue, the current flowing in the device because of their large trans-conductance.

Therefore, the present invention is to provide a LD-driver that, even if the driver is primarily constituted by current controlled devices, may effectively improve the output waveform of the LD by controlling the waveform of the modulation current precisely.

SUMMARY OF THE INVENTION

The LD-driver according to the present invention has a feature that the LD-driver provides a plurality of switched current sources, each of which outputs a current to the laser diode as a portion of the modulation current, and each current output from respective current sources is different in at least one of an amplitude, a phase and a pulse width.

In the LD-driver according to the invention, the modulation current supplied to the LD is superposed with respective currents output from the switched current source, and the amplitude, the phase and the pulse width may be varied independent to each other. Therefore, even when the switched current source is constituted with current controlled devices such as bipolar transistor, the waveform of the modulation current may be optionally adjusted so as to improve the waveform of the optical output from the LD. The LD-driver of the invention may be applicable to a signal source for the long-reach optical communication; because the LD-driver may effectively suppress the influence of the resonance oscillation of the LD appeared in the leading edge of the modulation current.

The LD-driver of the invention may further include a bias current source, aphotodiode, andanauto-power-control (APC) unit. The bias current source provides the bias current to the LD. The photo diode monitors a portion of an optical output from the LD. Thus, the bias current source, the LD, the PD and the APC unit constitutes an APC loop to keep the optical output from the LD constant. The each switched current source may include a differential circuit comprising of a pair of bipolar transistors and a current source. Emitters of each transistor are commonly connected to the current source, and one of collectors is connected to the LD. The APC loop may include each current source in the switched current source.

The LD-driver may further include a plurality of pre-amplifiers each connected to one of the switched current sources. One of pre-amplifiers is configured to receive a driving signal, to vary one of the phase and the pulse width and to output the varied driving signal to the corresponding switched current source in a differential mode. While, one of the other pre-amplifiers is configured to receive the driving signal, to vary the other of the phase and the pulse width and to output the varied driving signal to the corresponding switched current source in the differential mode. Thus, the currents output from each switched current source have the amplitude, the phase and the pulse width independent to each other.

BRIEF DESCRIPTION OF DRAWINGS

FIG. 3A shows a waveform of the modulation current derived from one of the switched current source, while.

FIG. 5A is an eye-diagram of the optical output derived from the conventional LD-driver, while.

FIG. 9A is an eye-diagram of the optical output based on the conventional LD-driver when the extinction ratio is set to be 12 dB, while

FIG. 12A shows a typical base characteristic of a bipolar transistor, where the collector current is plotted against the base bias voltage, while

DESCRIPTION OF PREFERRED EMBODIMENTS

Next, preferred embodiments of the present invention will be described in detail as referring to accompanying drawings. In the description of drawings, the same numerals or symbols will refer to the same elements without overlapping explanations.

Figure 1:
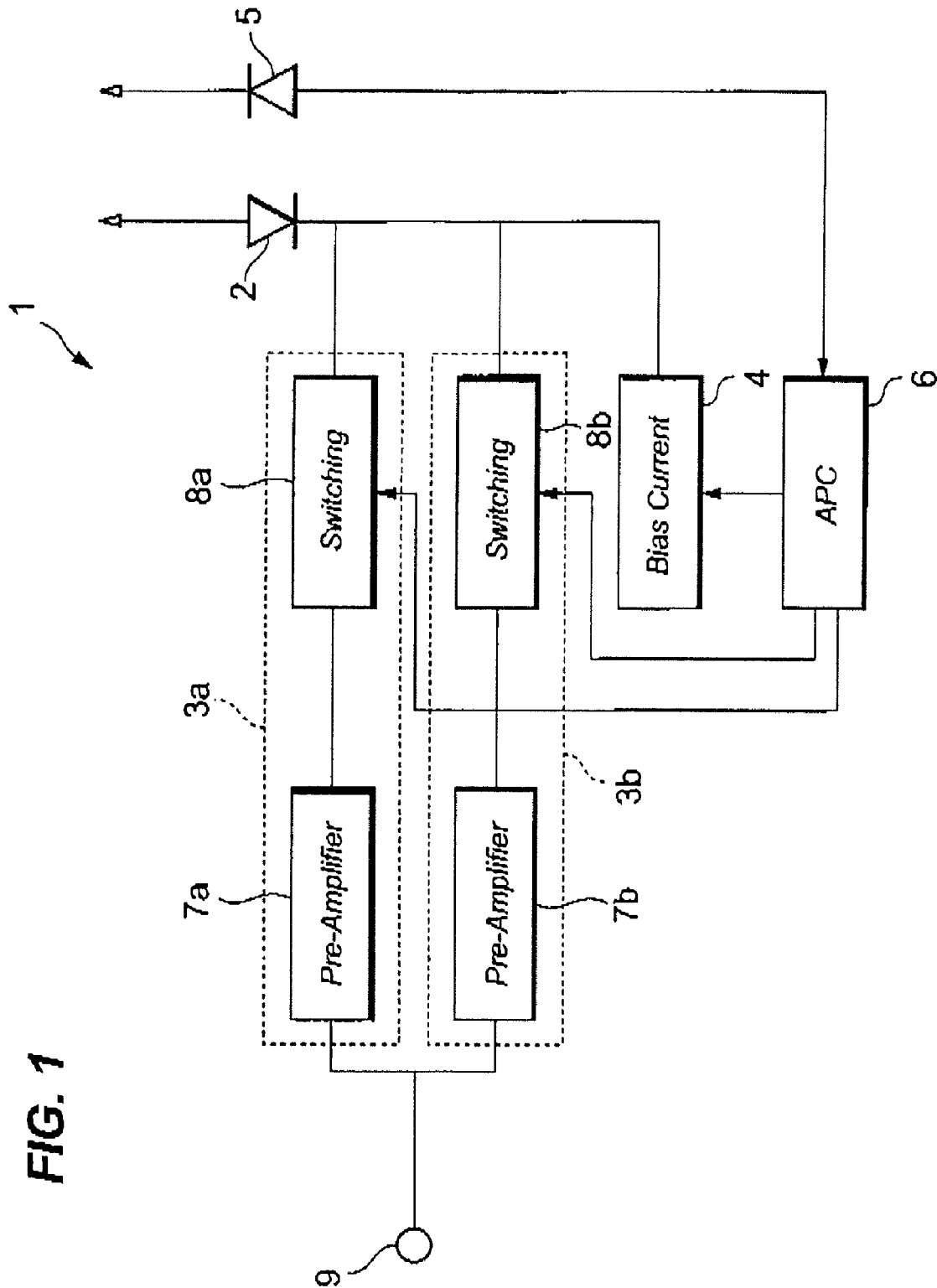
FIG. 1 is a block diagram of the LD-driver according to an embodiment of the present invention.
Figure 2:
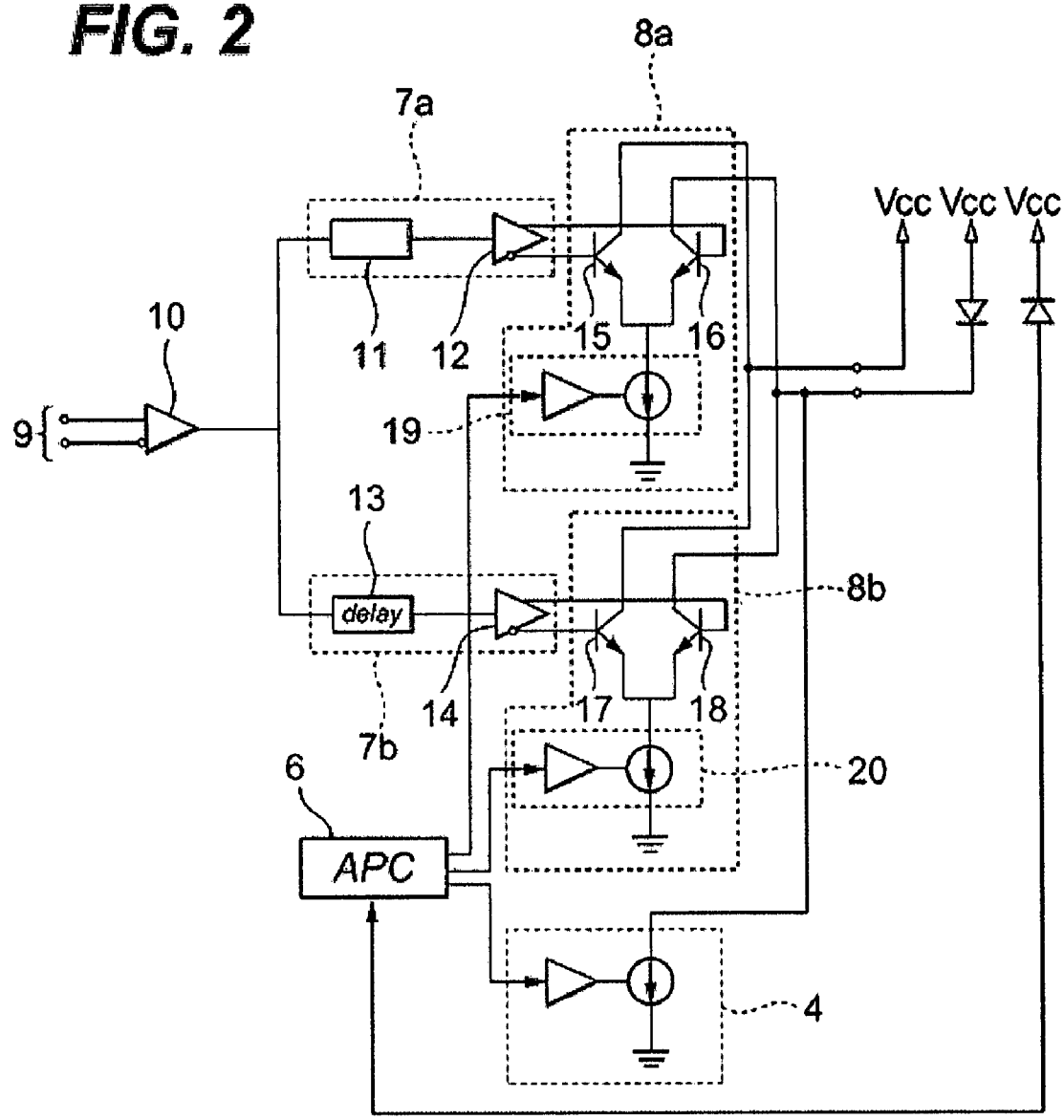
FIG. 2 is an example of a circuit diagram of the LD-driver whose block diagram is shown in FIG. 1.

FIG. 1 is a block diagram of the LD-driver according to an embodiment of the present invention, and FIG. 2 is a circuit diagram of the LD-driver shown in FIG. 1. The LD-driver 1, which is installed within an optical transmitter for the optical communication system, drives a light-emitting device such as a semiconductor laser diode (hereafter denoted as LD). As shown in FIG. 1, the LD-driver 1 includes two modulation current sources, 3a and 3b, a bias current source 4, a photodiode 5 for monitoring an optical output emitted from the LD2, and an Auto-Power Control (hereafter denoted as APC) circuit 6.

The modulation current sources, 3a and 3b, supply a modulation current to the LD 2, and each includes a pre-amplifier, 7a or 7b, and a switched current source, 8a or 8b. Each pre-amplifier, 7a or 7b, receives a driving signal provided in the input terminal 9, and the outputs are lead to respective switched current source, 8a or 8b. The output of each switched current source, 8a or 8b, is commonly connected to the cathode of the LD 2. The bias current source 4 supplies the bias current to the LD 2 and is also connected to the cathode of the LD 2.

The APC 6 receives an output of the PD 5 and is connected in the output thereof to the bias current source 4 and respective switched current sources, 8a and 8b. The APC 6, based on the output of the PD 6, controls the magnitude of the bias current output from the bias current source and the magnitude of the modulation current output from each modulation current source, 3a or 3b.

Next, the operation of the LD-driver 1 will be described as referring to FIG. 2.

The data input 9 provides a pair of terminals that receive signals complementary to each other to modulate the optical output from the LD 2. The paired input terminals couples with the inputs of the differential amplifier 10, while, the output of the differential amplifier 10 is divided to respective pre-amplifiers, 7a and 7b. The differential amplifier may be called as a signal buffer. Although the interconnection between the differential amplifier 10 and the pre-amplifiers, 7a and 7b, and the interconnections within the pre-amplifiers, 7a and 7b, are illustrated as the single line, these lines may be differential lines. The input impedance of the paired input terminal 9 may be terminated to, for instance, 50Ω.

The first pre-amplifier 7a includes a pulse width modulator 11 and the differential amplifier 12. The pulse width modulator 11 receives the output from the signal buffer, while, the output thereof couples to the amplifier 12. As mentioned previously, the interconnection between the pulse width modulator 11 and the amplifier 11 may be a paired line to transmit the complementary signal. The pulse width modulator 11 adjusts the pulse width of the modulation current output from the first switched current source 8a relative to the modulation current output from the second switched current source 8b.

The other pre-amplifier 7b includes a delay unit 13 and the amplifier 14. The delay unit 13 receives the output of the buffer amplifier 10, while, the output thereof couples with the amplifier 14. The delay unit 13 adjusts the phase of the modulation current output from the second switched current source 8b relative to that output from the first switched current source 8a. As mentioned previously, the interconnection between the delay unit 13 and the amplifier 14 may be a complementary line.

The switched current source 8a configures a differential circuit with a paired transistors, 15 and 16, and a current source 19. The each transistor, 15 or 16, commonly connects the emitter thereof that is lead to the current source 19, while, one of the collector 15 directly connects the power supply Vcc and the other collector indirectly connects the power supply Vcc through the LD 2. These paired transistors, 15 and 16, receive the output of the amplifier 12 in respective bases, thus, the transistors, 15 and 16, operate in the differential mode.

Similarly, the other switched current source 8b includes a paired transistor, 17 and 18, and a current source 20. The transistors commonly connect in the emitters thereof to the current source 20, while, one of the collector 18 directly connects the power supply Vcc and the other collector 18 indirectly connects the power supply Vcc through the LD 2. The paired transistors, 17 and 18, receive the complementary output of the amplifier 14 and operate in the differential mode.

The LD 2 in the cathode thereof is connected to two switched current sources, 8a and 8b, and the bias current source 4, while the anode thereof receives the power supply Vcc. Thus, the LD 2 may emit light depending on these switched current sources, 8a and 8b, and the bias current source 4. In the present invention, because the LD-driver 1 provides two switched current sources, 8a and 8b, which corresponds to the modulation current source in conventional LD-drivers, and not only the relative width and the amplitude but also the relative phase of respective currents may be precisely adjustable, the optical output from the LD 2 may be precisely controlled not only in the magnitude but also in the shape thereof.

The PD 5 detects a portion of the light output from the LD 2 and outputs a monitoring signal depending on the magnitude of the optical output to the APC unit. The APC unit 6, based on this monitoring signal from the PD 5, adjusts the magnitude of the bias current output from the bias current source 4 and two modulation currents each output from the switched current source, 8a or 8b. That is, the APC unit 6 adjusts those currents so as to maintain the average of the optical output emitted from the LD 2 independent of ambient temperatures of the LD 2.

Next, the present LD-driver will be compared with a conventional driver.

Figure 8:
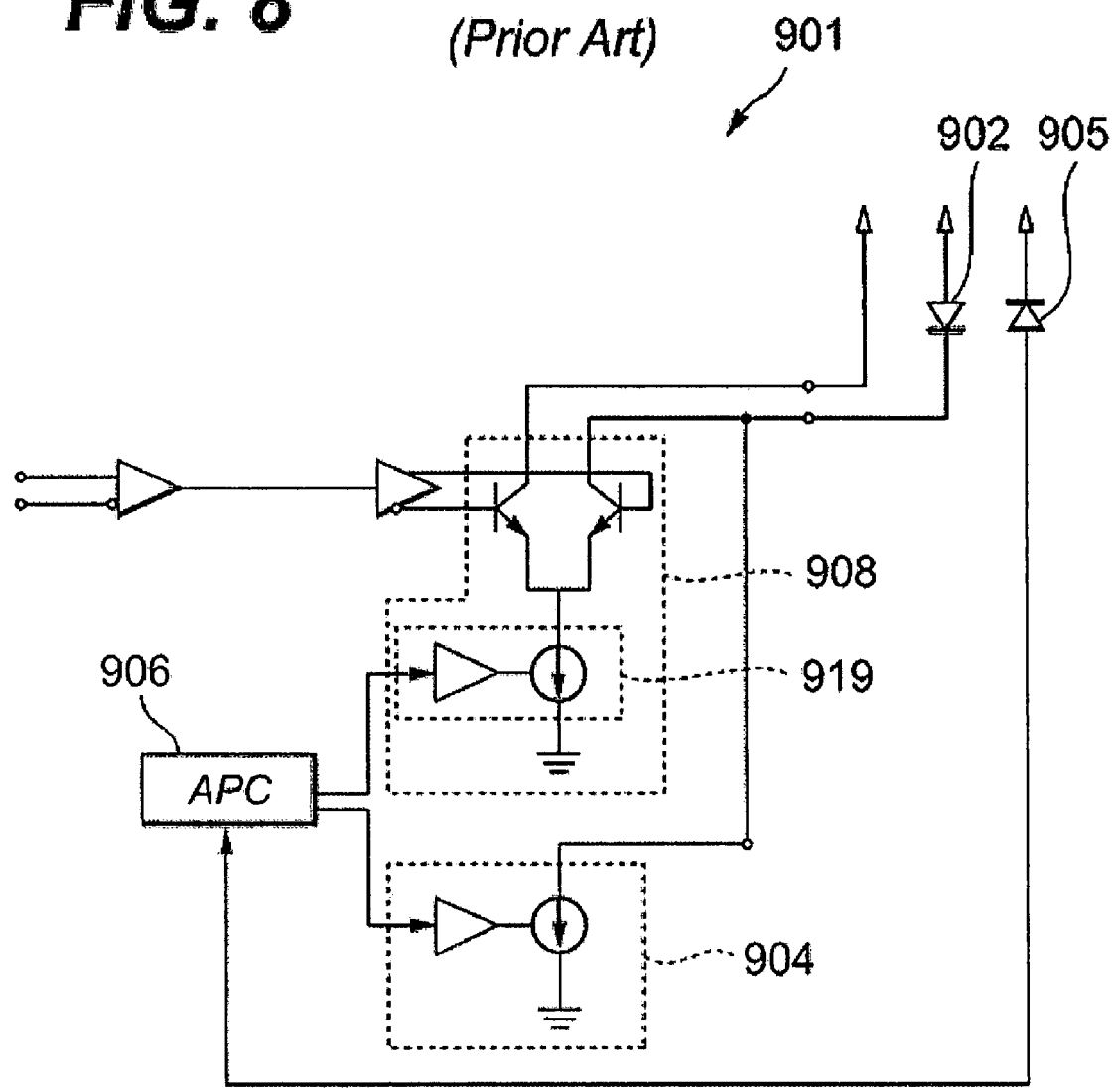
FIG. 8 is a circuit diagram of a conventional LD-driver.

FIG. 8 illustrates a typical circuit diagram of a conventional LD-driver 901. This LD-driver 901 includes a bias current source 904, a modulation current source 908, a monitoring PD 905, an APC unit 906 and an LD 902. The modulation current source 908 provides a switching circuit constituted with a paired transistor, and switches the current provided from the current source by the complementary signal received in respective bases of the paired transistor. Thus, the LD 2 may be modulated by the complementary signal.

Figure 9A:
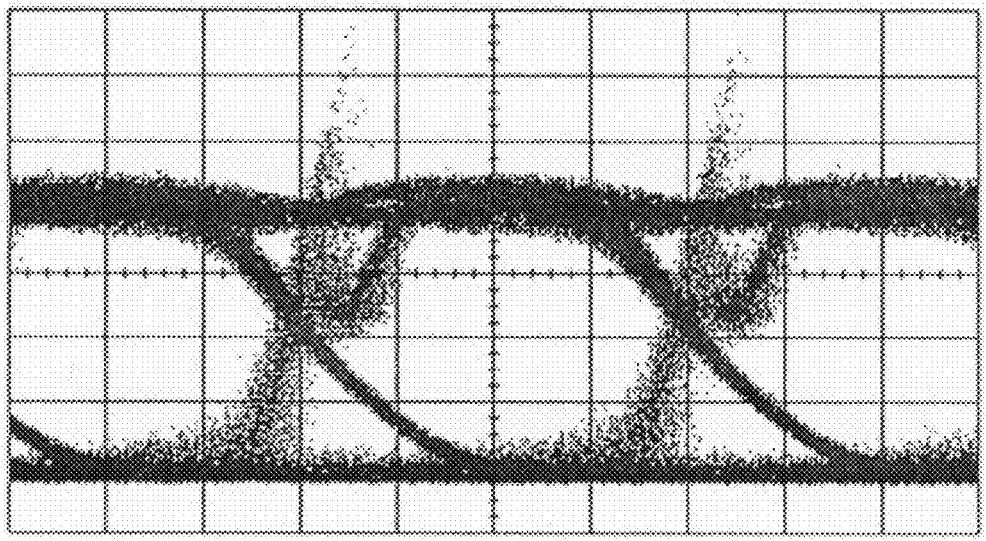
Figure 9B:
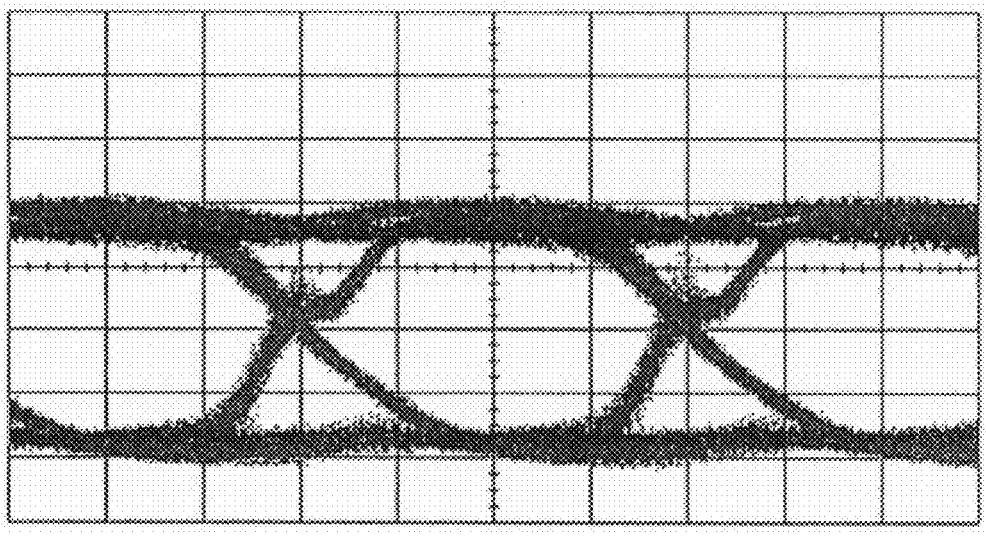
FIG. 9B is an eye-diagram based on the conventional LD-driver when the extinction ratio is set to be 8 dB.

FIG. 9 shows an output wave form of the LD 901, where FIG. 9A corresponds to the extinction ratio of 12 dB, while FIG. 9B is a result when the extinction ratio is 8 dB. The modulation signal input to the LD-driver 901 was based on the pseudorandom signal generated in the 23-steps sequencer with a rate of 2.48832 Gbps. FIG. 9A clearly shows a sharp ringing at leading edges of the signal which reflects the relaxation frequency of the LD 902. This ringing may be suppressed by a certain extent by adjusting the extinction ratio as shown in FIG. 9B. However, the reduction of the extinction ratio accompanies with the decrease of the amplitude of the optical signal.

Figure 10:
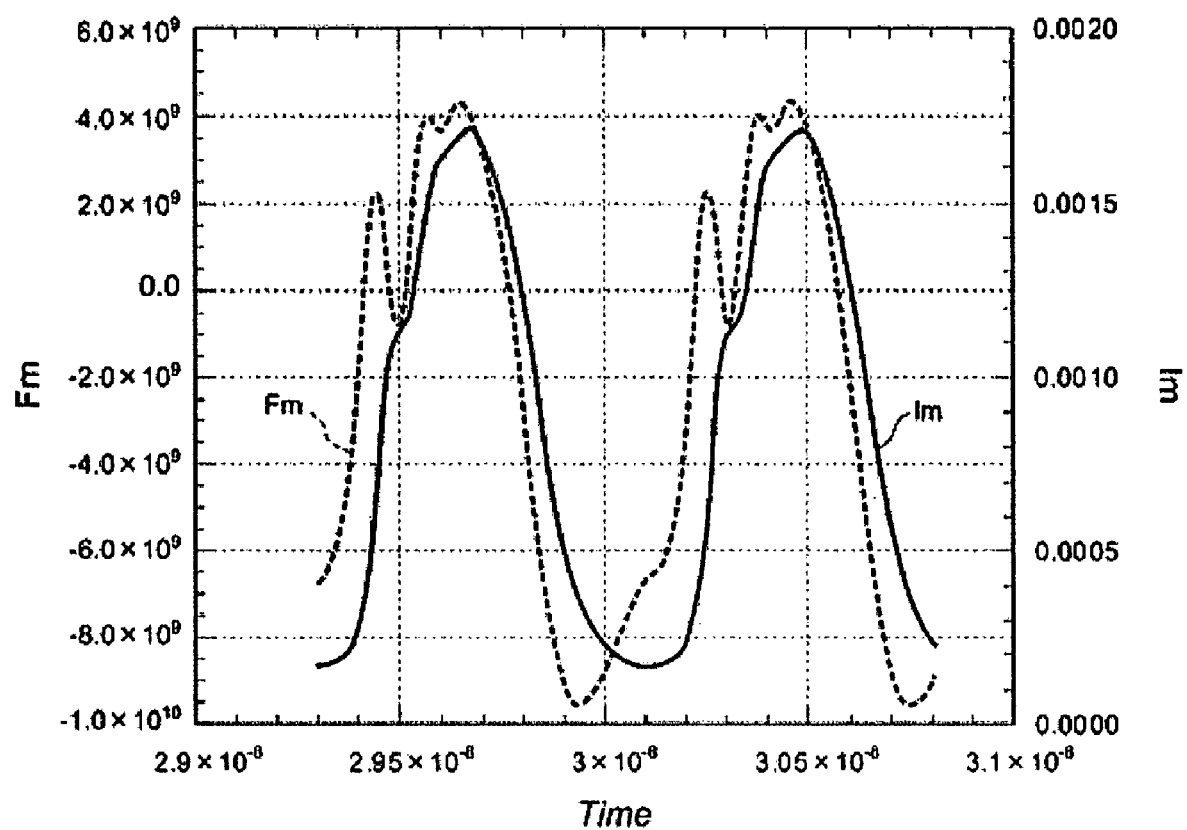
FIG. 10 compares the behaviors of the oscillation wavelength with that of the optical output power from the LD based on the conventional LD-driver shown in FIG. 8.
Figure 11A:
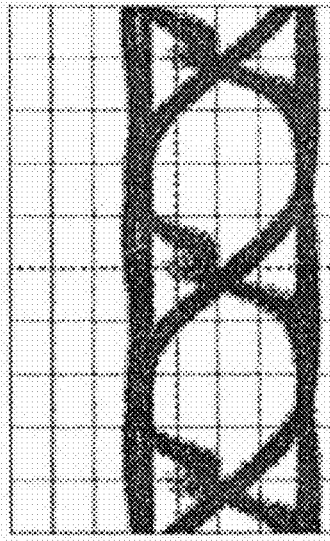
FIGS. 11A to 11C compare the optical waveform derived from the conventional LD-driver shown in FIG. 8 when the transmission length is 0 km, 100 km and 200 km, where the upper diagrams correspond to a case when the LD is driven by the pseudo-random signal, while the lower diagrams correspond to another chase when the LD is driven by a rectangular pulse.
Figure 11A:
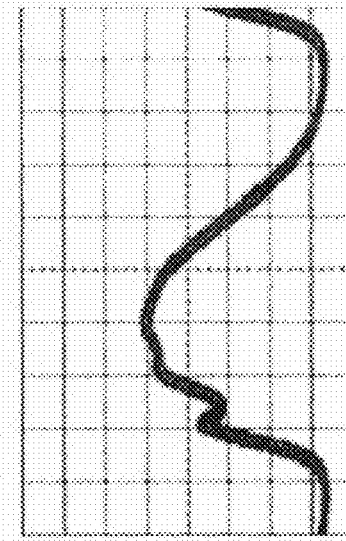
Figure 11B:
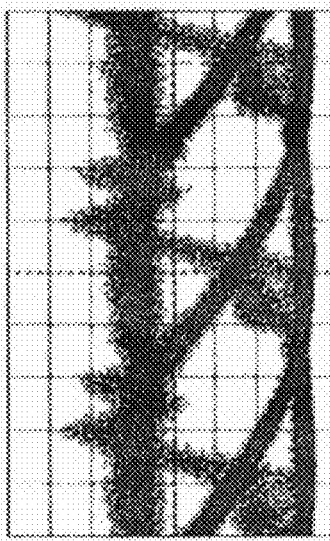
Figure 11B:
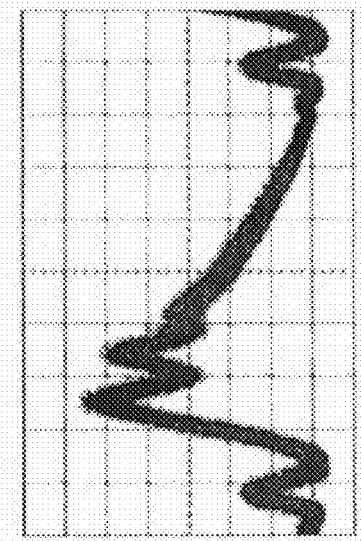
Figure 11C:
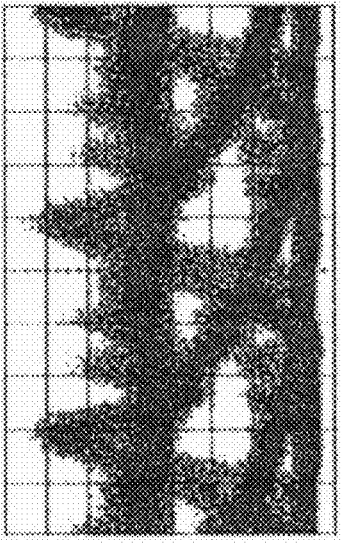
Figure 11C:
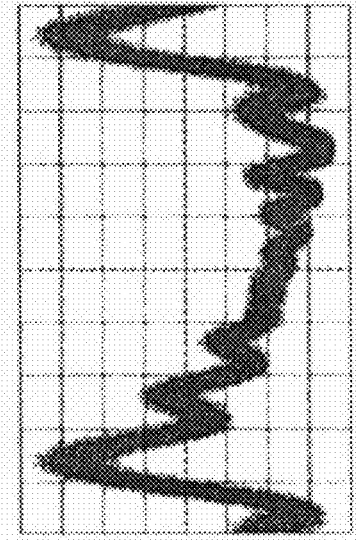

FIG. 10 shows fluctuations of the output frequency Fm, which is equivalent to the output wavelength of the LD 902, and that of the output power Im. The output frequency Fm, that is the output wavelength of the LD 902, widely fluctuates at the leading edge of the optical output power Im. This fluctuation in the output wavelength is often called as the chirp; in particular, the transient chirp appeared at the leading edge of the driving signal. FIGS. from 11A to 11B show the optical signals monitored at the position just output from the LD-driver 901 (FIG. 11A), the position 100 km apart from the LD-driver 901, and the position 200 km apart from the driver 901, respectively. In FIG. 11, the upper diagrams correspond to the results when the LD-driver 901 is driven by the 23-steps pseudo-random signal, while the lower diagrams correspond to the cases when the driver 901 is driven by the rectangular signal repeating the state "1" and the state "0". Thus, the ringing becomes to expand and to degrade the eye opening of the optical signal as the transmission range increases.

Figure 12A:
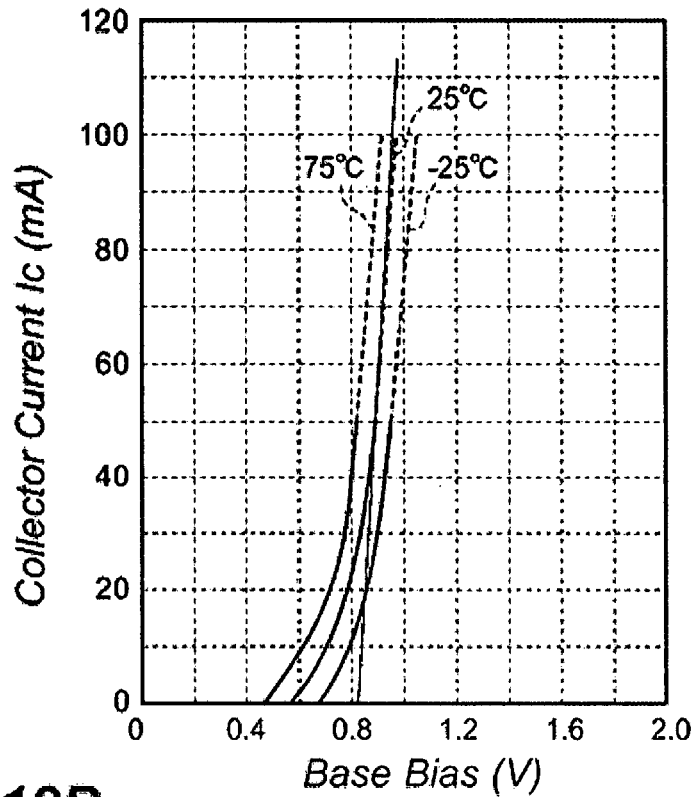
Figure 12B:
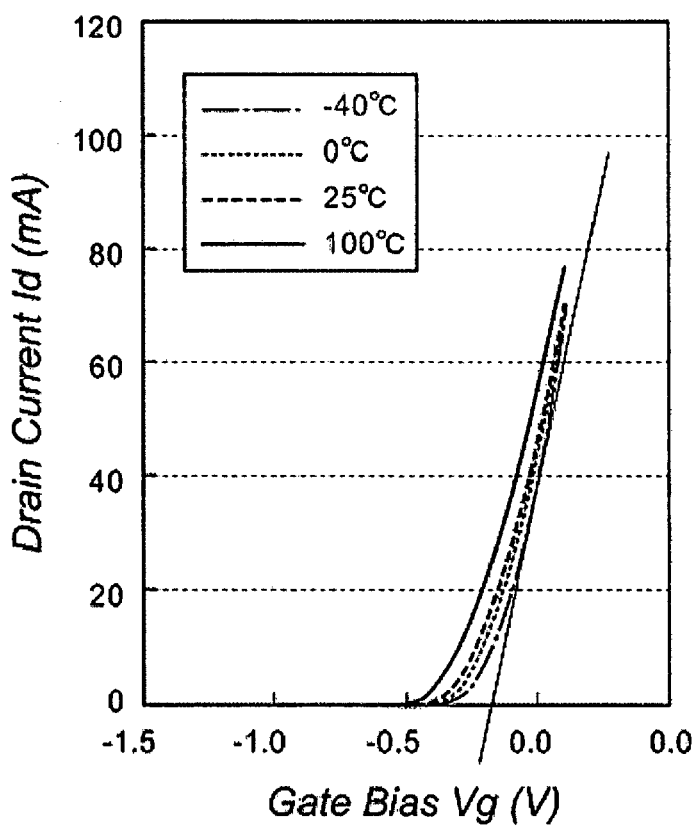
FIG. 12B shows a typical gate characteristic of a field effect transistor, where the drain current is plotted against the gate bias voltage.

FIG. 12A shows a characteristic of the base current Ib against the collector current Ic of a bipolar transistor at the constant collector-emitter bias condition of 5 V, while, FIG. 12B shows a characteristic of the drawing current Id against the gate voltage Vg of a FET at the constant drain-source bias of 2 V. The FET shows a moderate current characteristic compared to that of the bipolar transistor, which results in the simple control of the output current of the modulation current source. Because of its steep current characteristics the bipolar transistor tends to behave as a switching device. Moreover, the bipolar transistor is necessary to take the cut-off frequency for the current gain ft into account, which influences the current switching performance. The bipolar transistor primarily made of SiGe (Silicon-Germanium) shows further faster switching characteristics compared to that made of Silicon and becomes quite popular in high-frequency and high-speed applications. Thus, it becomes quite hard to adjust the waveform of the current signal applied to the LD only by re-shaping the input signal.

The LD-driver 1 according to the present invention provides two modulation current sources, 3a and 3b, that is the LD 2 receives the modulation current from the current source 3a superposed on the current derived from the other source 3b. Respective modulation currents may be precisely controlled in their amplitudes, phases and pulse widths by each switched current source, 8a or 8b. Thus, even the switched current sources, 8a and 8b, include current controlled switching devices, namely bipolar transistors, the waveform of the modulation current supplied to the LD 2 may be easily and precisely controlled.

Moreover, the LD-driver 1 of the invention provides the APC function comprised of the PD 5, the APC unit 6 and the bias current source 4. The APC function adjusts the bias and the modulation currents so as to keep the average optical output from the LD constant, which stabilizes the optical output independent of the ambient temperature.

Figure 3A:
Figure 3B:
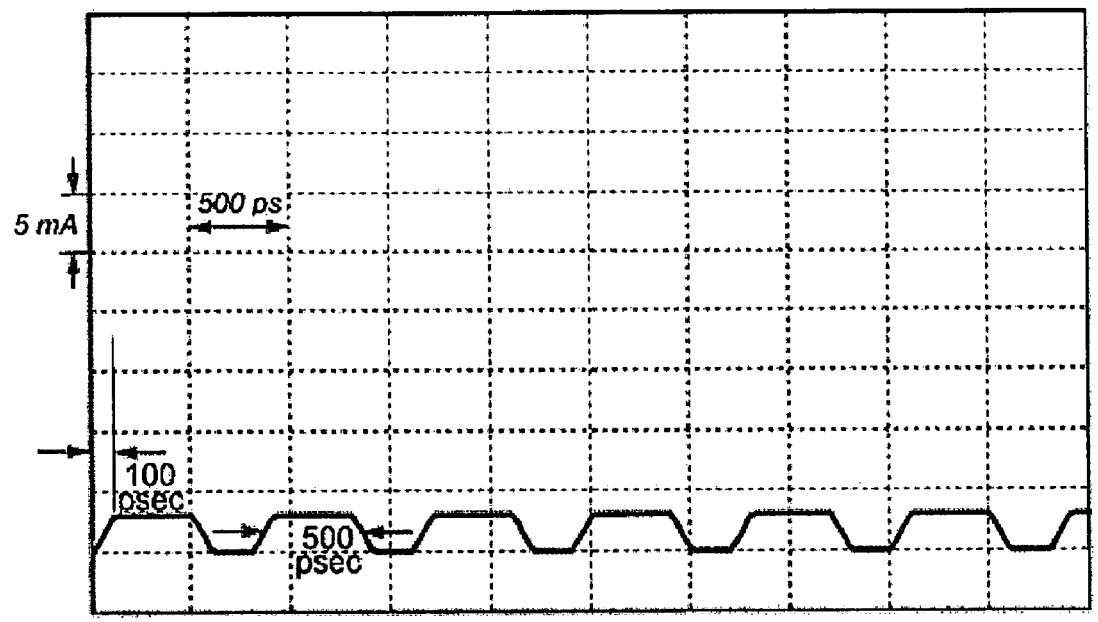
FIG. 3B shows a waveform of the modulation current derived from the other switched current source.
Figure 4:
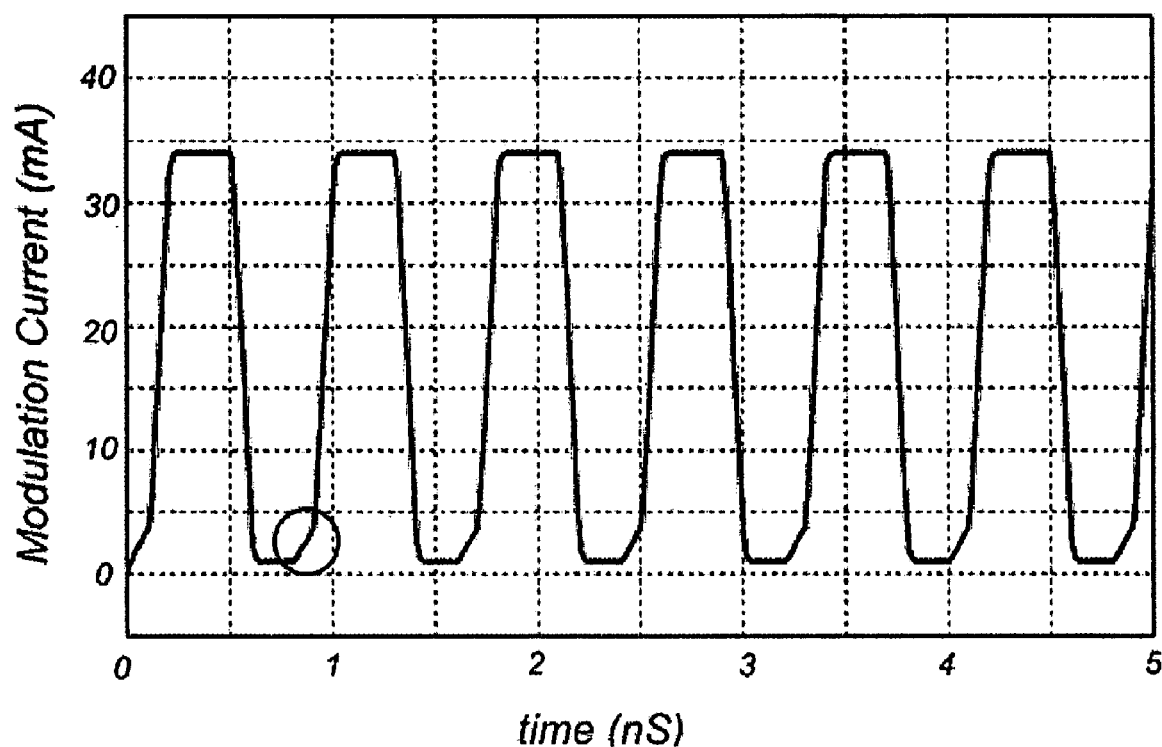
FIG. 4 shows the waveform of the modulation. current superposing the waveform shown in FIG. 3A with that shown in FIG. 3B.

FIG. 3A shows a typical example of the current output of the switched current source 8b, while, FIG. 3B shows the current output from the other switched current source 8a. FIG. 4 shows an example of the modulation current provided to the LD 2, which is a sum of two current outputs from respective switched current sources, 8a and 8b. These figures were obtained under conditions of; the LD 2 has the threshold current of 15 mA; the first modulation current derived from the switched current source 8b is 30 mA in the amplitude thereof, while, the other modulation current from the switched current source 8a is 3 mA; the phase difference between two modulation currents was 100 psec, where the phase of the first modulation current from the first source 8a advances to the other modulation current from the source 8b; the pulse width of the first modulation current is 500 psec, while that of the other modulation current is 400 psec; and the bias current is set to be 16 mA. The bipolar transistors constituting the switched current sources, 8a and 8b, are made of SiGe and have a cut-off frequency ft of 50 GHz.

Figure 13:
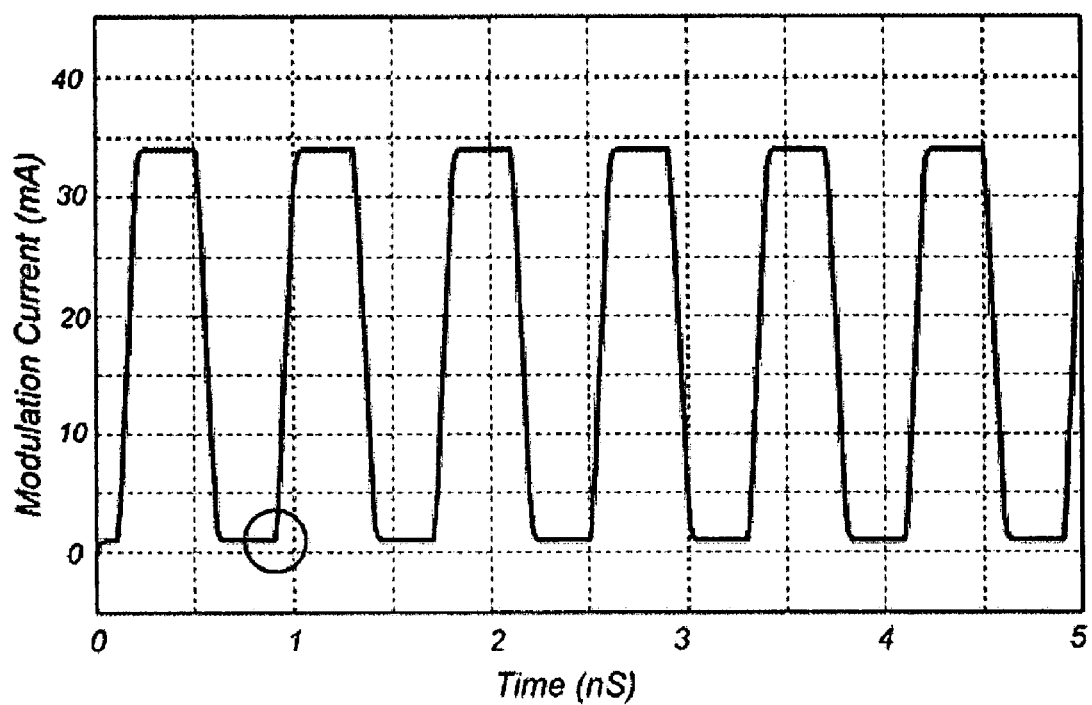
FIG. 13 shows a waveform of a modulation current in the conventional LD-driver shown in FIG. 8.

The superposed modulation current, which is a sum of two currents derived from respective switched current sources, 8a and 8b, shows a rising time of about 60 psec, where the rising time is defined by a time between a point 20% of the full amplitude and a point 80% of the full amplitude. FIG. 13 compares the waveform of the modulation current in the conventional driver 901. The conditions for the conventional driver are; the LD has the threshold current of 15 mA, the bias current of 16 mA, and the modulation current of 33 mA. The modulation current shown in FIG. 13 also shows the rising time of about 60 psec.

Comparing the modulation currents each shown in FIG. 4 and FIG. 13, the LD-driver according to the present invention, even the leading edge has a relaxed region in its slew rate by superposing two currents each having different amplitudes, phases and pulse widths, the full amplitude and the rising time of the modulation current may be maintained, that is, no explicit difference can be recognized. The full amplitude and the rising time dominate the primary portion of the optical waveform output from the LD 2. Only the leading edge from the status of no modulation current to a status where the significant current is supplied to may be relaxed to reduce the unstable emission due to the resonance oscillation.

Figure 5A:
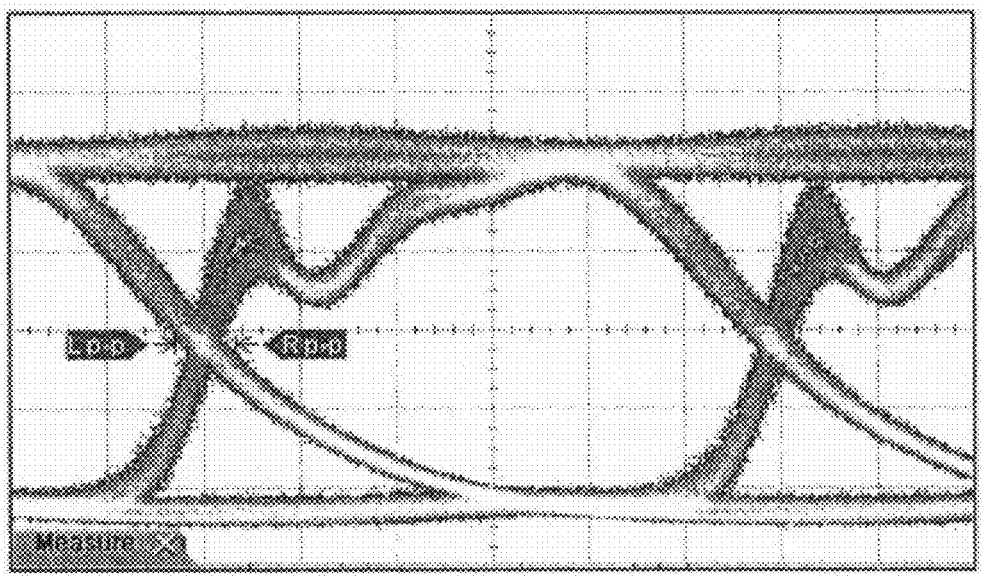
Figure 5B:
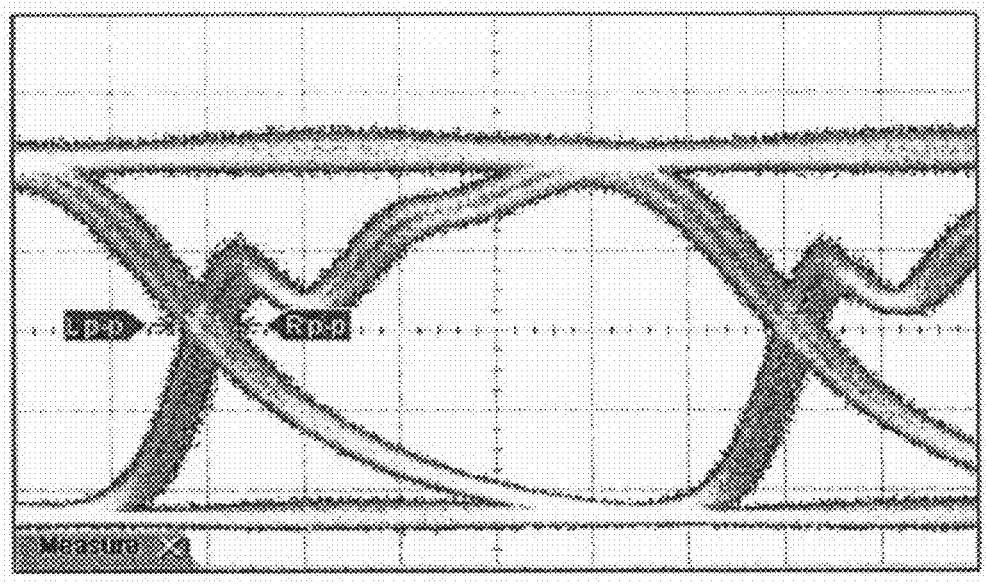
FIG. 5B is an eye-diagram of the optical output derived from the present invention.

FIG. 5A shows an optical output based on the conventional driver 901, while, FIG. 5B shows an optical output derived from the LD-driver according to the invention. The modulation and bias currents applied to the LD was adjusted such that the extinction ratio of 9.8 dB and the optical output power of −1.5 dBm were obtained. The LD was a type of the distributed feedback (DFB) LD with an oscillation wavelength of 1610 nm. As shown in FIGS. 5A and 5B, the waveform derived from the conventional driver (FIG. 5A) appeared a peak like behavior in the leading edge thereof, which was considered to be caused by the resonance oscillation of the LD. On the other hand, the waveform derived from the present driver (FIG. 5B) reduces this peak like behavior in the leading edge with maintaining the extinction ratio, the rising and falling time.

Next will compare the chirp characteristic of the optical output based on the conventional driver 901 and on the present driver. Although the direct measurement of the transient chirp such as shown in FIG. 12 may be carried out, the experiment described below may substitute the direct measurement.

Figure 6:
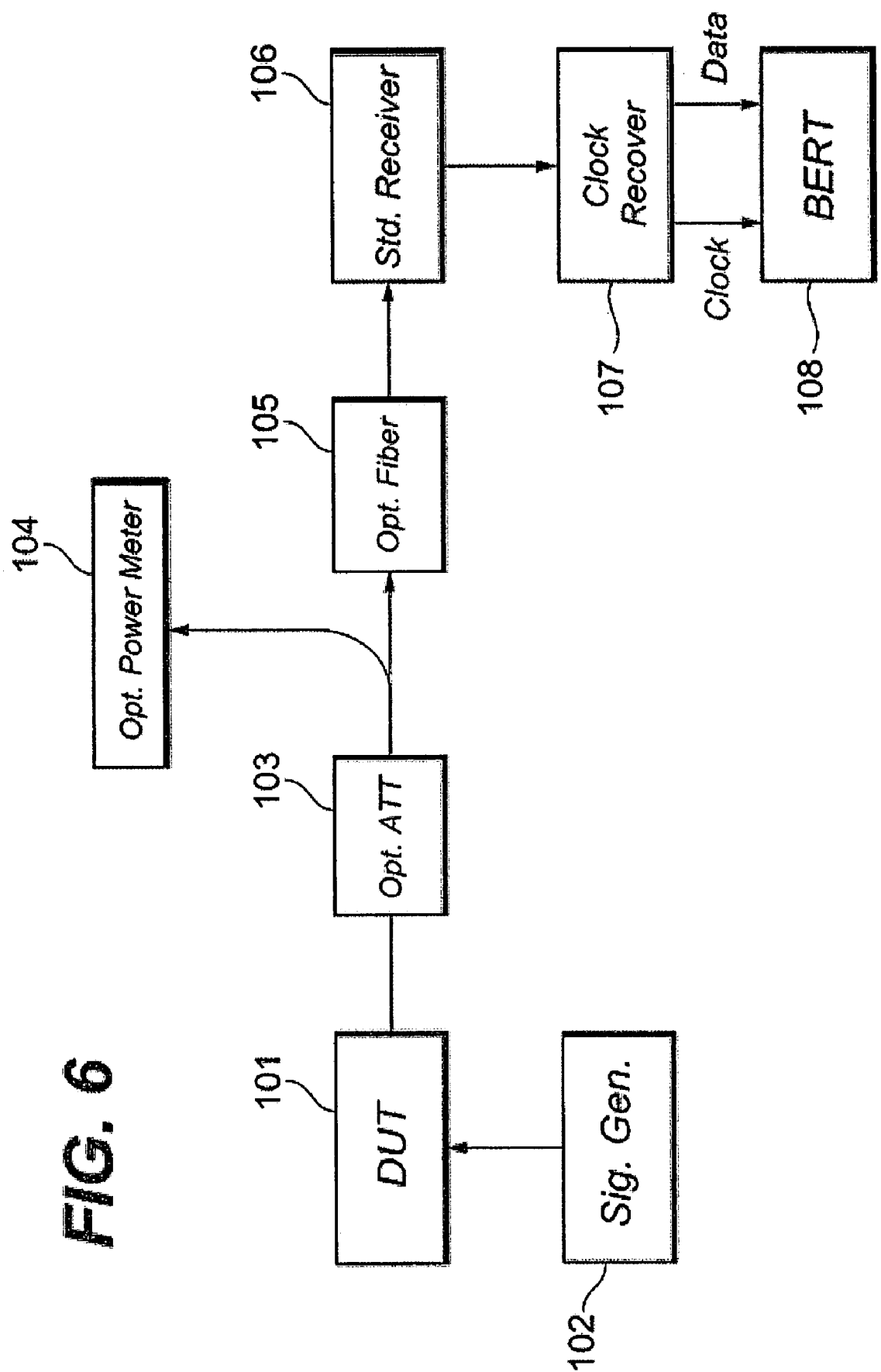
FIG. 6 shows a setup to measure the transmission penalty.

FIG. 6 is a block diagram of the measurement setup to compare the chirp characteristic. The DUT 101, which is the "Device Under Test", includes an LD and an LD-driver driven by the 32-bit pseudo-random signal with the transmission rate of 2.48832 Gbps generated by the signal generator 102. The optical signal output from the DUT 102, passing thorough the variable optical attenuator (ATT) 103 to adjust the output power thereof, is divided into two paths by the 3 dB coupler. One of optical signals is monitored by the optical power monitor 104, while the other of the signals is guided in the optical fiber 105 and is received by the standard optical receiver 106, which converts the optical signal to an electrical signal. The standard receiver 106 generally has a performance in the bit error rate of around $10^{-10}$ at the optical input power of −32 dBm.

The output of the standard receiver 106 is sent to the clock recovery unit 107 that extracts the clock component and recovers the data component both contained in the input data. Thus extracted clock and data are guided to the bit error rate tester (BERT) to evaluate the error rate. The evaluation of the error rate was carried out at a condition where the length of the optical fiber 105 is about 1 m, which is called as the "Back to Back condition"; and another condition where the optical fiver is 80 km length, which corresponds to the transmission length of 80 km. The normal single mode fiber shows a wavelength dispersion of around 1600 psec/nm, accordingly, a large chirp characteristic of the optical source strongly affects the resultant optical waveform after the 80 km transmission. When the receiver receives such degraded optical signal shown in FIG. 11, the receiver inevitably decreases its sensitivity, which is called as the transmission penalty.

Figure 7A:
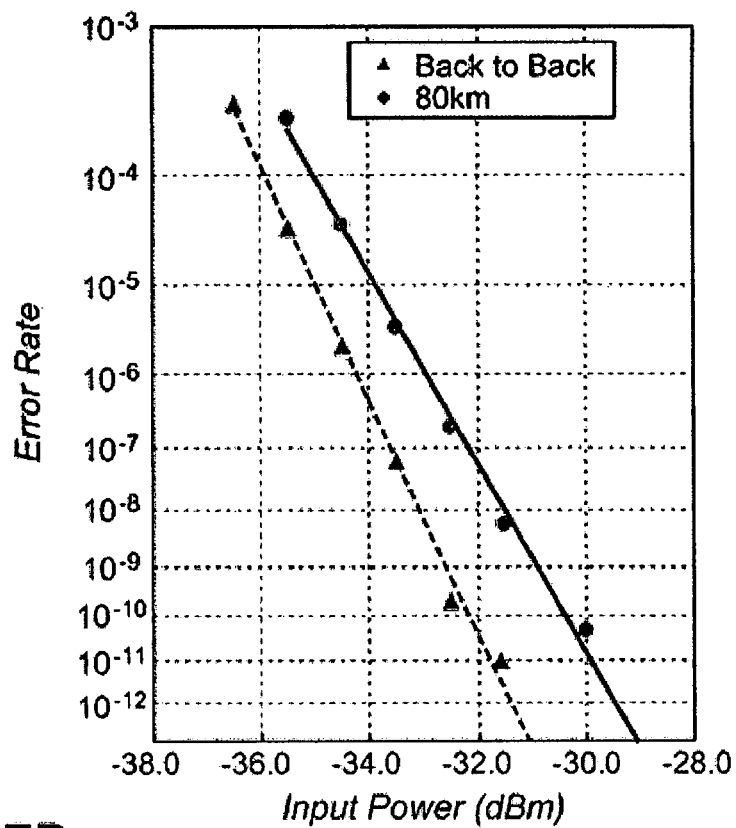
FIG. 7A shows error rates based on the conventional LD-driver.
Figure 7B:
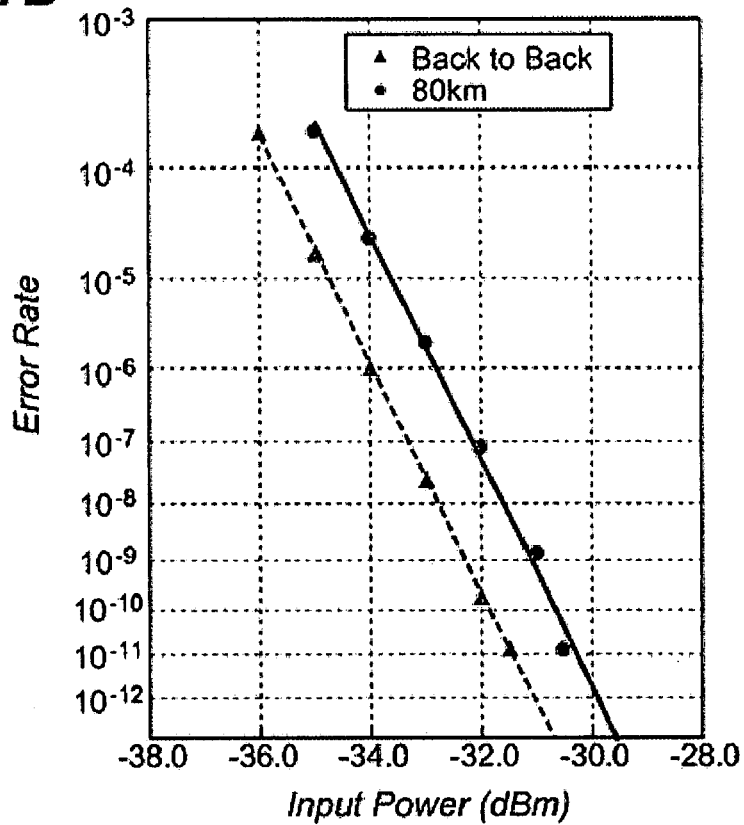
FIG. 7B shows error rates based on the present invention, both of which are measured by the setup shown in FIG. 6.

FIG. 7A shows results of the conventional driver, while, FIG. 7B shows results of the error rate of the present driver, both of which were measured by the setup shown in FIG. 6. Assuming the transmission penalty is a difference in the optical power where the error rate is $10^{-10}$ between the back-to-back condition and the 80 km transmission, the conventional. driver shows the penalty of 1.82 dB, while the present driver may improve the penalty up to 1.15 dB, that is, the present driver may improve the transmission penalty by 0.67 dB. This is due to the loosing of the rising edge in the modulation current to suppress the resonance oscillation of the LD, which directly reduces the fluctuation in the oscillation wavelength of the LD, namely, the chirp characteristic of the LD. Thus, the performance of the optical transmitter may be increased in a long reach transmission.

While the preferred embodiments of the present invention have been described in detail above, many changes to these embodiments may be made without departing from the true scope and teachings of the present invention. The present invention, therefore, is limited only as claimed below and the equivalents thereof. For example, although, the embodiments include the bipolar transistors with a type of SiGe heterobipolar transistor for the switched current source, the LD-driver of the invention may apply another type of transistors including the FETs.

Moreover, although the embodiment provides two switched current sources, 8a and 8b, the LD-driver of the invention may further provide another one or more switched current sources to precisely adjust the waveform of the modulation current. Therefore, it is to be understood that the scope of the invention also comprehends embodiments different from those described, yet within the scope of the claims. Words of inclusion are to be interpreted as non-exhaustive in considering the scope of the invention.

I claim:

1. A laser diode driver to provide a bias current and a modulation current to a laser diode by receiving a driving signal, comprising:
    a plurality of switched current sources, each switched current source including a differential circuit having a pair of bipolar transistors with commonly connected emitters and a current source connected with the emitters, the current source outputting a current as a portion of the modulation current to the laser diode;
    a bias current source for providing a bias current to the laser diode;
    a photodiode to monitor a portion of an optical output from the laser diode; and
    an auto-power-control (APC) unit configured to constitute an APC loop combined with the laser diode, the photodiode and each current source of respective switched current sources, the APC loop for maintaining the optical output emitted from the laser diode constant,
    wherein each current output from each current source in respective switched current sources is different in at least one of amplitude, a phase and a pulse width.

2. The laser diode driver according to claim 1 wherein the bipolar transistor is primarily made of SiGe.

3. The laser diode driver according to claim 1, further comprising a plurality of pre-amplifiers, each pre-amplifier being connected to respective switched current sources,
    wherein one of the pre-amplifiers is configured to receive the driving signal, to vary the phase of the driving signal and to output the varied driving signal to the corresponding switched current source, and
    wherein one of the other pre-amplifiers is configured to receive the driving signal, to vary the pulse width of the driving signal and to output the varied driving signal to the corresponding switched current source.

4. The laser diode driver according to claim 3, further comprising a buffer amplifier to receive the driving signal in a differential mode and outputs the driving signal to each of said pre-amplifiers in the differential mode,
    wherein each pre-amplifier outputs the varied driving signal to the switched current source in the differential mode.

5. The laser diode driver according to claim 1, further comprising a plurality of pre-amplifiers each connected to respective switched current sources,
    wherein each pre-amplifier is configured to receive the driving signal, to vary the phase and the pulse width of the driving signal independent to other pre-amplifiers and to output the varied driving signal to the corresponding switched current source.

6. The laser diode driver according to claim 5, further comprising a buffer amplifier to receive the driving signal in a differential mode and outputs the driving signal to each of said pre-amplifiers in the differential mode,
    wherein each pre-amplifier outputs the varied driving signal to the respective switched current source in the differential mode.

7. A laser diode driver to provide a bias current and a modulation current to a laser diode by receiving a driving signal, comprising:
    a bias current source for providing a bias current to the laser diode;
    a plurality of modulation current sources, each providing a current as a portion of the modulation current to the laser diode;
    a photodiode to monitor a portion of an optical output from the laser diode; and
    an auto-power-control (APC) unit to control the bias current source and the plurality of modulation current sources,
    wherein the currents provided from the respective modulation current sources are different from each other in at least one of a phase and a pulse width.

8. The laser diode driver according to claim 7, further including a plurality of switched current sources, one switched current source providing a delay unit attributed to a delay time different from that of another switched current source.

9. The laser diode drive according to claim 8, wherein said one switched current source further provides an amplifier to receive an output from the delay unit and a differential circuit having a current source configured with one of said modulation current sources, and wherein the delay unit and amplifier comprise a pre-amplifier for driving the differential circuit in a differential mode.

10. The laser diode driver according to claim 7, wherein one of said plurality of modulation current sources provides a modulation current different in magnitude than that of another modulation current source.

11. A laser diode driver for a laser diode that emits light corresponding to a driving signal under an auto-power-control (APC) loop combined with a photodiode that monitors light output from the laser diode, a bias current source being connected in series to the laser diode and an APC unit of the APC loop, the laser diode driver comprising:

a plurality of switched current sources, each providing a differential circuit and a current source, the differential circuit switching a current provided from the current source as a portion of the modulation current in accordance with the driving signal; and a plurality of pre-amplifiers, each coupled with one of the switched current sources and having a delay unit attributed with a delay time, wherein the delay times of respective delay units are different from each other.

12. The laser diode according to claim 11, wherein each of the current sources of respective switched current sources is controlled by the APC unit.

* * * * *